United States Patent
Satoh et al.

(10) Patent No.: US 7,718,004 B2
(45) Date of Patent: May 18, 2010

(54) GAS-INTRODUCING SYSTEM AND PLASMA CVD APPARATUS

(75) Inventors: Kiyoshi Satoh, Tama (JP); Yasushi Fukasawa, Tama (JP); Kazuya Matsumoto, Tama (JP)

(73) Assignee: ASM Japan K.K., Tokyo (JP)

( * ) Notice: Subject to any disclaimer, the term of this patent is extended or adjusted under 35 U.S.C. 154(b) by 711 days.

(21) Appl. No.: 11/262,103

(22) Filed: Oct. 28, 2005

(65) Prior Publication Data
US 2006/0090700 A1 May 4, 2006

(30) Foreign Application Priority Data
Oct. 29, 2004 (JP) .................. 2004-316503

(51) Int. Cl.
*C23C 16/452* (2006.01)
*H01L 21/306* (2006.01)

(52) U.S. Cl. .............. 118/715; 156/345.33; 156/345.34

(58) Field of Classification Search .......... 118/715; 156/345.33, 345.34
See application file for complete search history.

(56) References Cited

U.S. PATENT DOCUMENTS

| | | | |
|---|---|---|---|
| 5,624,498 A * | 4/1997 | Lee et al. ................ 118/715 |
| 5,695,564 A | 12/1997 | Imahashi | |
| 5,788,778 A | 8/1998 | Shang et al. | |
| 5,891,253 A | 4/1999 | Wong et al. | |
| 5,935,334 A | 8/1999 | Fong et al. | |
| 5,997,685 A | 12/1999 | Radhamohan et al. | |
| 6,050,506 A | 4/2000 | Guo et al. | |
| 6,148,761 A | 11/2000 | Majewski et al. | |
| 6,364,954 B2 * | 4/2002 | Umotoy et al. ........... 118/715 |
| 6,491,978 B1 * | 12/2002 | Kalyanam ............ 427/255.394 |
| 6,638,886 B1 * | 10/2003 | Gupta et al. ............... 501/127 |
| 6,645,884 B1 * | 11/2003 | Yang et al. ................. 438/791 |
| 6,736,147 B2 * | 5/2004 | Satoh et al. ................. 134/1.1 |
| 2003/0097987 A1 * | 5/2003 | Fukuda .................. 118/723 E |
| 2003/0124842 A1 * | 7/2003 | Hytros et al. ............... 438/680 |
| 2004/0200412 A1 * | 10/2004 | Frijlink ..................... 118/715 |
| 2005/0034674 A1 * | 2/2005 | Ono .......................... 118/728 |
| 2005/0150601 A1 * | 7/2005 | Srivastava ............. 156/345.33 |
| 2005/0279731 A1 * | 12/2005 | Saito et al. ................... 216/58 |
| 2006/0138082 A1 * | 6/2006 | Strang ......................... 216/59 |
| 2007/0119371 A1 * | 5/2007 | Ma et al. ................. 118/723 E |

FOREIGN PATENT DOCUMENTS

JP   10-149989   6/1998
JP   10-163185   6/1998

* cited by examiner

*Primary Examiner*—Jeffrie R Lund
*Assistant Examiner*—Satish Chandra
(74) *Attorney, Agent, or Firm*—Knobbe, Martens, Olson & Bear LLP

(57) ABSTRACT

A gas-introducing system for plasma CVD and cleaning includes: a showerhead including a top plate with a gas inlet port and a shower plate; a rectifying plate installed in the interior space of the showerhead and dividing the interior space into an upper space and a lower space; a structure for inhibiting inactivation of active species of the activated cleaning gas at the rectifying plate; and a piping unit for connecting the gas inlet port of the showerhead to a remote plasma unit and a reaction gas introduction port.

20 Claims, 3 Drawing Sheets

GAS-INTRODUCING SYSTEM AND PLASMA CVD APPARATUS

BACKGROUND OF THE INVENTION

1. Field of the Invention

The present invention generally relates to a semiconductor processing apparatus, and specifically to a plasma CVD apparatus having a self-cleaning device.

2. Description of the Related Art

Traditionally, CVD apparatuses have been used to deposit insulation film made of silicon oxide, silicon nitride, amorphous carbon or polymers containing benzene rings, conductive film made of tungsten silicide, titanium nitride or aluminum alloy, or high dielectric constant film containing PZT ($PbZr_{1-x}Ti_xO_3$), BST ($Ba_xSr_{1-x}TiO_3$) or the like, on silicon substrates or glass substrates.

To deposit these films, reaction gas or secondary reaction gas, of various compositions, is supplied to the reactor. When plasma energy is applied, the reaction gas causes chemical reaction and forms a desired thin film on a semiconductor substrate. The film resulting from the reaction also attaches to the interior walls of the reactor and the surface of the susceptor. When the film deposition process is repeated on many substrates, these attachments also accumulate and eventually separate from the reactor walls/susceptor surface to float inside the reactor. The floating material becomes a source of impurities and contaminants that cause defects in the produced semiconductor circuits.

"In-situ cleaning," which is a process of cleaning the interior of the reactor while the reactor is operating, is an effective way to remove the contaminants attached to the interior walls of the reactor. Under this method, cleaning gas selected in accordance with the type of attachment is introduced to the reactor to gasify and thereby remove the attachments. For example, CF4, C2F6 or NF3 is used as cleaning gas, among others, if the attached material is silicon oxide or nitride, or tungsten or its nitride or silicide. In this case, active species containing fluorine atoms or fluorine (fluorine radicals) gasify the attachments on the interior walls of the reactor and remove impurities.

On a plasma CVD apparatus, directly utilizing the plasma excitation device used for film deposition to activate cleaning gas causes the electrodes to receive large ion bombardments due to the large high-frequency power applied to the cleaning gas. As a result, the electrode surface is damaged and the surface layer separates, thus generating impurities and contaminants. The damaged electrodes must be replaced frequently, which causes the running cost to increase.

To resolve the problem of ion bombardments, a method called "remote plasma cleaning" was developed. Japanese Patent Laid-open No. 10-149989, Japanese Patent Laid-open No. 10-163185, and U.S. Pat. No. 5,788,778, for example, disclose the method to use NF3 as cleaning gas and activate the cleaning gas using microwaves inside a second plasma discharge chamber away from the reactor.

According to the above publications, NF3 is introduced to an isolated second plasma discharge chamber at a controlled flow rate, and then dissociated and activated by the 2.45 GHz microwaves supplied to the plasma discharge chamber via a waveguide from a microwave oscillator, to generate fluorine radicals. At this time, a pressure regulation valve provided between the second plasma reaction chamber and the reactor maintains the second plasma reaction chamber at a specified pressure, so that microwave plasma discharge occurs efficiently. Generated fluorine radicals are introduced via a conduit pipe into the reactor where film is deposited, to gasify and thereby remove the attachments on the interior walls of the reactor. Separately, U.S. Pat. No. 6,736,147 discloses an apparatus wherein a remote plasma discharge chamber and a reactor are connected by way of an aluminum pipe and a through-flow valve.

In the process of depositing thin film on wafers, generally film deposition gas is supplied uniformly over the entire wafer surface from a showerhead so that film is deposited uniformly over the entire wafer. This showerhead has many pores from which to supply the gas in a uniform manner. Installed above of the showerhead is a blocker plate used to straighten the flow of gas. This blocker plate serves to control and adjust in the section above the showerhead the flow of film deposition gas supplied from a gas supply pipe, in order to allow the film deposition gas to be supplied uniformly over the wafer from the showerhead. U.S. Pat. No. 5,935,334 discloses an apparatus having a blocker plate inside a showerhead. To adjust the gas flow, this blocker plate dams up the film deposition gas introduced from an introduction pipe, and then supplies the gas onto the top surface of the showerhead through multiple openings. As a result, the film deposition gas is supplied onto the wafer with sufficient uniformity.

SUMMARY OF THE INVENTION

While improving the problem of ion bombardments, the remote plasma cleaning method also gave rise to a new set of problems as explained below. When cleaning gas, which is activated in the remote plasma discharge chamber, is supplied through the introduction pipe and travels through the blocker plate to the showerhead and finally into the film deposition area, active species containing fluorine excited in the remote plasma discharge chamber collide with the blocker plate, upon which the active species discharge energy and become inactive.

The inventor discovered that even when the blocker plate is made of conventional alumina ceramics, the rate of this inactivation becomes high and the cleaning speed consequently drops by approx. 25% as compared with the initial cleaning speed. This may be because the blocker plate made of conventional alumina ceramics has a porous surface structure and can be explained as follows, although any theories described herein are not intended to limit all embodiments of the present invention. When active fluorine species collide with the blocker plate, thermal energy generates and causes microcracks at the surface of the blocker plate. These micro-cracks cause fine particles to separate, which then attach to the surfaces of the blocker plate and showerhead. These attached fine particles mainly comprising aluminum oxide or aluminum fluoride increase the surface area of the blocker plate and thereby promote the inactivation of cleaning gas containing active fluorine species.

A drop in cleaning speed due to inactivation of cleaning gas does not affect the operating condition of the remote plasma discharge chamber nor it affects the pressure or other operating condition of the reactor. Accordingly, such drop in cleaning speed is difficult to detect during the operation of the apparatus. If the cleaning speed drops, the interior of the reactor cannot be sufficiently cleaned within the specified cleaning time, in which case residual material will attach to the wafers processed after the cleaning and cause wafer contamination. If the apparatus is used for long hours, the cleaning speed drops gradually. To restore the cleaning speed, the blocker plate and showerhead must be replaced periodically. This maintenance must be performed with the apparatus stopped, which causes the productivity to drop significantly.

Consequently, the invention provided in the present patent application was developed to address the aforementioned problems. Specifically, in an embodiment, an object of the present invention is to provide a plasma CVD apparatus having a remote plasma discharge chamber that can eliminate ion bombardments and thereby inhibit the cleaning speed from dropping.

To solves one or more of the aforementioned problems, in an aspect, the present invention provides a gas-introducing system for plasma CVD and cleaning, comprising: (i) a showerhead comprising a top plate with a gas inlet port though which a reaction gas or activated cleaning gas is to be introduced into an interior space of the showerhead, and a shower plate having multiple holes through which the reaction gas or activated cleaning gas is to be discharged into a reactor; (ii) a rectifying plate installed in the interior space of the showerhead, dividing the interior space into an upper space and a lower space, and having multiple holes through which the upper space and the lower space are communicated; (iii) a means for inhibiting inactivation of active species of the activated cleaning gas at the rectifying plate; and (iv) a piping unit for connecting the gas inlet port of the showerhead to a remote plasma unit and a reaction gas introduction port.

The aforesaid aspect further includes, but is not limited to, the following embodiments:

The means may be a material of the rectifying plate (at least a surface thereof) which is selected from a group consisting of sapphire and alumina ceramics with a purity of 99.95% or higher (including 99.96%, 99.97%, 99.98%, 99.99%, and ranges between any two numbers of the foregoing). The rectifying plate may preferably have a surface roughness of about 0.5 µm or less (including 0.3 µm, 0.1 µm, and ranges between any two numbers of the foregoing), although in another embodiment, the surface roughness can be about 1.0 µm or less.

The means may be a structure wherein the piping unit comprises inner and outer pipes coaxially disposed, said inner pipe communicating the remote plasma unit and the lower space of the showerhead without exposing the active species of cleaning gas to the upper space of the showerhead, said outer pipe communicating the reaction gas introduction port and the upper space of the showerhead. The inner pipe may constitute a straight downward passage of the active species of cleaning gas from the remote plasma unit which is opened to the lower space of the showerhead.

The holes of the rectifying plate may have a size larger than that of the holes of the shower plate, and the number of the holes of the rectifying plate may be less than that of the holes of the shower plate. In an embodiment, an inner diameter of the hole may be about 5 mm to about 20 mm (including 10 mm, 15 mm, and ranges between any two numbers of the foregoing). In an embodiment, the number of the holes may be about 4 to about 100 (e.g., 4-10) which may be 1/10 to 1/1,000 (e.g., 1/50 to 1/200) of the number of holes provided in the shower plate. The rectifying plate may have a thickness of about 3 mm to about 20 mm (including 4 mm, 5 mm, 7 mm, 10 mm, 15 mm, and ranges between any two numbers of the foregoing). A distance between the rectifying plate and the top plate may be about 1 mm to about 20 mm (including 3 mm, 5 mm, 10 mm, 15 mm, and ranges between any two numbers of the foregoing), and a distance between the rectifying plate and the shower plate may be about 1 mm to about 20 mm (including 2 mm, 5 mm, 10 mm, 15 mm, and ranges between any two numbers of the foregoing).

The piping unit may include an insulating member which insulates the piping unit from the top plate. The showerhead may be connected to an RF power source. The reactor may be a reactor of a capacitively-coupled plasma CVD apparatus.

In another aspect, the present invention provides a self-cleanable plasma CVD processing apparatus comprising: (I) a reactor; (II) a susceptor provided inside the reactor to place a semiconductor substrate thereon; (III) any one of the aforesaid gas-introducing systems wherein the showerhead is installed parallel to and facing the susceptor; (IV) a remote plasma unit connected to the gas-introducing system to activate cleaning gas; and (V) at least one high-frequency power supply installed outside the reactor to supply power to the showerhead or the susceptor.

In the foregoing aspects and embodiments of the present invention, any element used in an embodiment can be interchangeably or additionally used in another embodiment as long as it is feasible. No restriction should not be imposed on selecting elements between embodiments. In particular, any of the dependent features described above should be able to be used in any of the independent configurations.

In another aspect, the present invention provides a self-cleanable plasma CVD processing apparatus comprising: (I) a reactor; (II) a susceptor provided inside the reactor to place a semiconductor substrate thereon; (III) a showerhead provided inside the reactor and installed in parallel with and facing the susceptor; (IV) a rectifying plate installed in an interior space of the showerhead and having multiple through-holes, said rectifying plate being composed of a material selected from the group consisting of sapphire and alumina ceramics with a purity of 99.95% or higher; (V) at least one high-frequency power supply installed outside the reactor to supply power to the showerhead or the susceptor; and (VI) a remote plasma discharge chamber installed outside the reactor to activate cleaning gas, wherein the interior of the reactor is self-cleaned by the cleaning gas activated inside the remote plasma discharge chamber. In the above, the activated cleaning gas may contain active fluorine species.

In still another aspect, the present invention provides a self-cleanable plasma CVD processing apparatus comprising: (I) a reactor; (II) a susceptor provided inside the reactor to place a semiconductor substrate thereon; (III) a showerhead provided inside the reactor and installed in parallel with and facing the susceptor; (IV) a rectifying plate installed in an interior space of the showerhead and having multiple through-holes; (V) at least one high-frequency power supply installed outside the reactor to supply power to the showerhead or the susceptor; (VI) a remote plasma discharge chamber installed outside the reactor to activate cleaning gas; (VII) a first pipe connecting the remote plasma discharge chamber with the reactor; and (VIII) a second pipe installed inside the first pipe coaxially with the first pipe, thereby forming a first channel inside the second pipe and a second channel between the first pipe and the second pipe, wherein in film deposition, a reaction gas is diffused to the rectifying plate via the second channel and supplied from the showerhead, and in cleaning, the activated cleaning gas is supplied from the showerhead via the first channel without being diffused to the rectifying plate.

The aforesaid aspect further includes, but is not limited to, the following embodiments:

The activated cleaning gas may contain active fluorine species. The rectifying plate may be composed of a material selected from the group consisting of alumina ceramics (a purity of 99.5% or higher, e.g., 99.7%), sapphire, aluminum, aluminum alloy, aluminum nitride, and magnesium oxide. When the piping is composed of the two channels, the material of the rectifying plate can be selected from various materials, because active species of cleaning gas does not directly hit against the rectifying plate surface.

In at least one or more of the above aspects and embodiments, the present invention realizes a plasma CVD apparatus that can eliminate ion bombardments while maintaining a high cleaning speed for a long period by effectively preventing the cleaning speed from dropping.

Also, in at least one or more of the above aspects and embodiments, the present invention also realizes a plasma CVD apparatus that achieves uniform film deposition and high cleaning speed at the same time.

Furthermore, in at least one or more of the above aspects and embodiments, the present invention can significantly reduce the time and cost required for maintaining the apparatus, thereby improving the productivity of the apparatus.

In the foregoing aspects and embodiments of the present invention, a combination of any two or more of the aspects and embodiments can be accomplished by one of ordinary skill in the art.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes.

DETAILED DESCRIPTION OF THE PREFERRED EMBODIMENT

The invention will be explained further with reference to specific embodiments and drawings. The embodiments and drawings are not intended to limit the present invention.

Figure 1:
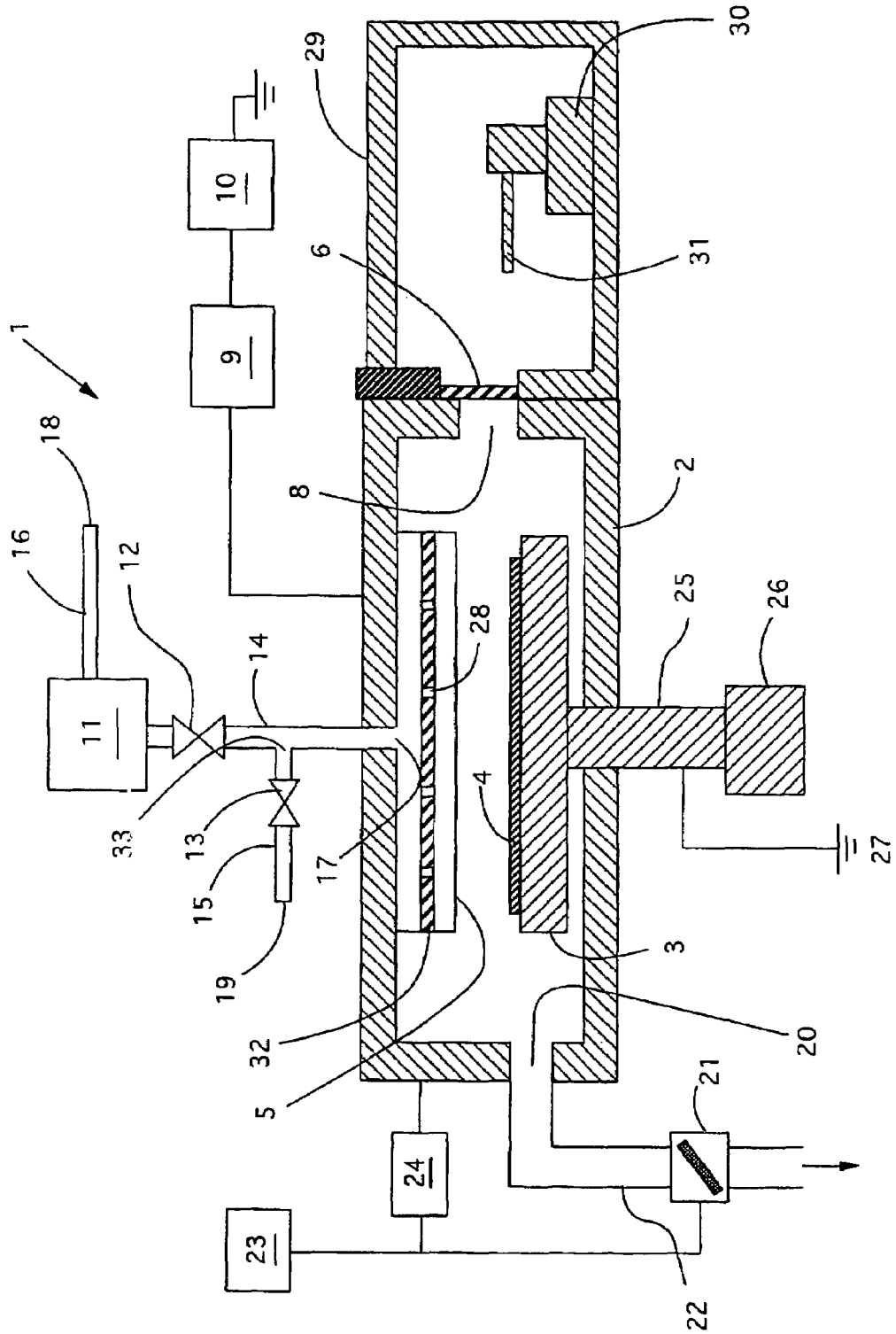
FIG. 1 shows a schematic drawing of a preferred embodiment of plasma CVD apparatus according to the present invention.

First, the present invention is explained in details by referring to the drawings. FIG. 1 shows a schematic cross-section view of a preferred embodiment of plasma CVD apparatus conforming to the present invention. This plasma CVD apparatus (1) has a reactor (2). Inside the reactor (2), a susceptor (3) for placing a semiconductor wafer (4) is installed. The susceptor (3) is made of anodized aluminum or aluminum alloy and also grounded (27) to define one electrode used in plasma discharge. A ring-shaped heating element (not shown) is embedded inside the susceptor (3) to, by working in conjunction with a temperature control unit (not shown), heat the semiconductor wafer (4) to a specified temperature and maintain the wafer temperature. The susceptor (3) may also be a ceramic heater. This ceramic heater may comprise a ceramic base in which a resistance heating element is embedded, and a metal body grounded to define one electrode used in plasma discharge. The ceramic base is made of a material offering excellent corrosion resistance as well as sufficient heat conductivity, an essential property of a heater, such as aluminum nitride, magnesium oxide or aluminum oxide. Tungsten is used for the resistance heating element, while tungsten or molybdenum is used for the metal body. A drive mechanism (26) that vertically moves the susceptor (3) is connected to the susceptor (3) via a support (25).

Inside the reactor (2), a showerhead (5) is installed in parallel with and opposing the susceptor (3). The shower plate may be made of an aluminum alloy coated with an anodized oxide film. The bottom surface of the showerhead (5) has several thousand pores (not shown), through which reaction gas is injected uniformly toward the semiconductor wafer (4). The showerhead (5) is electrically connected to at least one high-frequency oscillator (10) via an external matching circuit (9) to define the other electrode used in plasma discharge. Provided above the showerhead (5) is a gas outlet port (17) for introducing reaction gas or cleaning gas, and the gas outlet port (17) is connected to a pipe (14).

Figure 3:
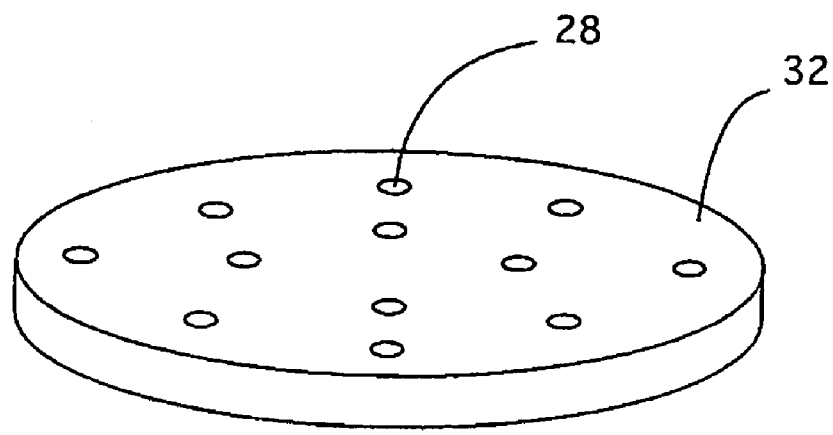
FIGS. 3(A) and (B) show perspective views of rectifying plates used in plasma CVD apparatuses according to an embodiment of the present invention.
Figure 3:
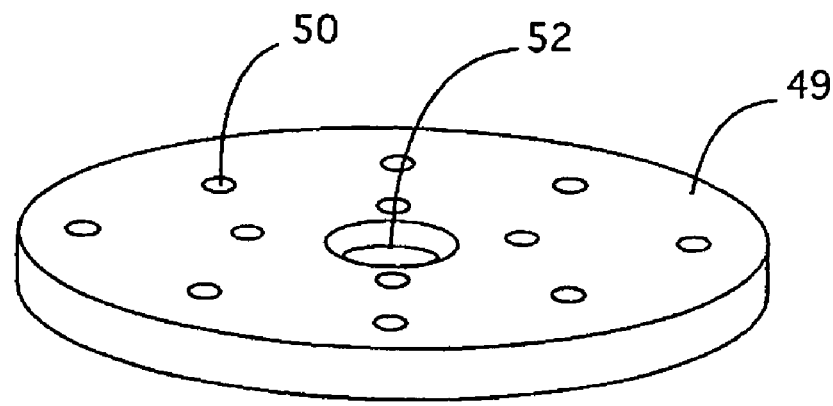

In the interior space of the showerhead (5), a rectifying plate (32) is provided for controlling and diffusing the gas as it flows into the space through the pipe (14). FIG. 3(A) shows a perspective view of this rectifying plate (32). This rectifying plate (32) is a ceramic disc with a thickness in a range of 3 mm to 20 mm, or preferably in a range of 5 mm to 10 mm, in which multiple through-holes (28) are arranged radially at an equal spacing. Synthesized industrial sapphire is desirable as the ceramic material comprising the rectifying plate. Our test found, however, that alumina ceramics with a purity of 99.95% or higher would also provide an effective rectifying plate material. The number of the through-holes (28) may be 4-100 (e.g., 4-10). The inner diameter of the through-hole may be 4-20 mm. The surface roughness of the plate may preferably 0.5 µm or less.

An exhaust port (20) is provided in a side wall of the reactor (2), and a pipe (22) is connected to this exhaust port (20). A conductance adjustment valve (21) is provided in the middle of the pipe (22), and the exhaust port (20) connects to a vacuum exhaust pump (not shown) via this valve (21). The conductance adjustment valve (21) is electrically connected to an external pressure control unit (23) and an external pressure gauge (24), and adjusts the pressure in the reactor (2) to a desired level.

An opening (8) is provided in a side wall of the reactor (2), and this opening (8) is connected to a transfer chamber (29) via a gate valve (6). Inside the transfer chamber (29) is an automatic transfer robot (30) that carries in and out the semiconductor wafer (4) to and from the reactor (2). The automatic transfer robot (30) has a blade (31) for holding a semiconductor wafer.

A remote plasma discharge chamber (11) is placed outside the reactor (2). The remote plasma discharge chamber (11) is made of anodized aluminum alloy. A pipe (16) having an inlet port (18) through which cleaning gas flows in is connected to the remote plasma discharge chamber (11). The cleaning gas introduced through the inlet port (18) is controlled to a specified flow rate by a mass flow rate controller (not shown), and then enters the remote plasma discharge chamber (11). As cleaning gas, a fluoride gas containing nitrogen, carbon or chlorine, a mixed fluorine gas containing nitrogen or oxygen, or a mixed gas consisting of any of the aforementioned gases with oxygen or any inactive gas can be used. Specifically, a mixed gas consisting of NF3, ClF3, CF4, C2F6 or C3F8 and oxygen, a mixed gas consisting of NF3 and nitrogen, a mixed gas consisting of NF3 and rare gas, or a mixed gas consisting of ClF3 and rare gas can be used. Here, rare gas may be helium, argon, neon, xenon or krypton, for example. The remote plasma discharge chamber (11) and showerhead (5) are connected via the pipe (14).

One end of this pipe (14) defines the gas outlet port (17). The pipe (14) is made of aluminum or aluminum alloy, but it can also be made of stainless steel offering excellent corrosion resistance. The pipe (14) has a straight shape with an inner diameter of 1.27 cm or larger, or preferably 2.54 cm or larger, or more preferably 4 cm or larger.

The pipe (14) is provided with a valve (12). This valve (12) is characterized by not having any internal structure that limits the flow when the valve is open. The inner diameter of a channel in the valve (12) should not be significantly smaller than the inner diameter of the pipe (14), but it should desirably have the same diameter as the pipe. For example, the valve disclosed in U.S. Pat. No. 6,736,147 can be used in this embodiment, and the disclosure of the patent is incorporated herein by reference in its entirety.

Provided on a side wall of the pipe (14) connecting the valve (12) and the gas outlet port (17) is a reaction gas introduction port (33). The reaction gas introduction port (33) is connected to a reaction gas introduction pipe (15). The other end of the reaction gas introduction pipe (15) defines a reaction gas inlet port (19) through which reaction gas is introduced. Between the reaction gas inlet port (19) and the reaction gas introduction port (33) is a valve (13). The number of reaction gas introduction pipe (15) is not limited to one, and multiple pipes can be provided in accordance with the type of reaction gas. To prevent reaction gas or cleaning gas from adsorbing to their surfaces, the pipe (14) and valve (12) are heated to a specified temperature by a heater (not shown). The heating temperature can be set freely in accordance with the type of reaction gas or cleaning gas. Because of this heating mechanism, the reaction gas introduction pipe (15) and valve (13) between the reaction gas introduction port (33) and reaction gas inlet port (19) are also heated.

In the plasma CVD apparatus conforming to the present invention, as illustrated in FIG. 1, the cleaning gas activated inside the remote plasma discharge chamber (11) is also introduced from the gas outlet port (17) just like reaction gas, and then flow-controlled by the rectifying plate (32). Thereafter, the cleaning gas travels through the multiple through-holes (28) in the rectifying plate (32) and is injected uniformly into a process space through the numerous pores in the showerhead (5). One characteristic of the present invention is that sapphire or alumina ceramic material with a purity of 99.95% or higher is used as the material of the rectifying plate (32). Use of either of these materials substantially reduces the rate of inactivation, by the rectifying plate, of the active species contained in the cleaning gas, thereby preventing the cleaning speed from dropping.

Figure 2:
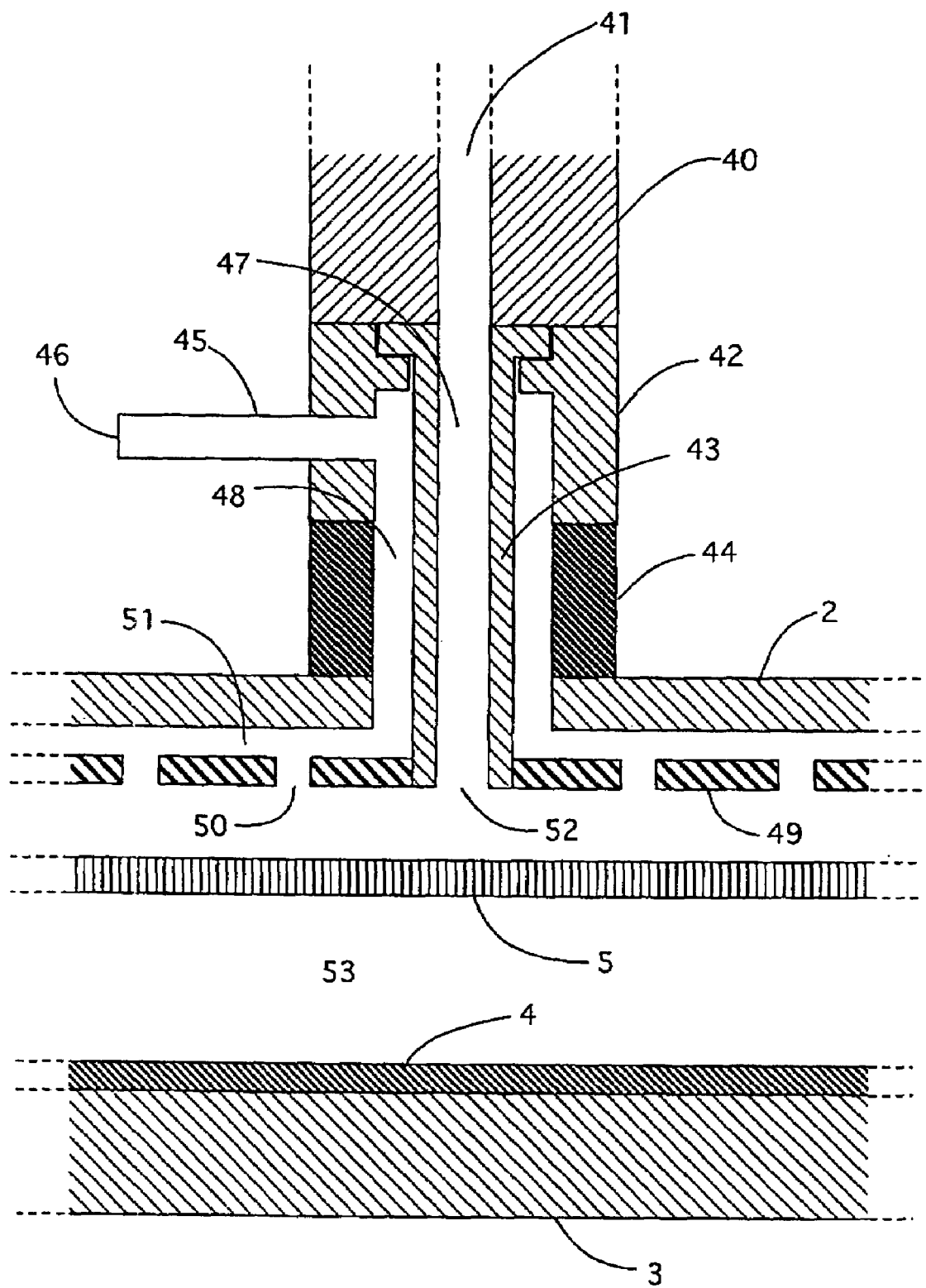
FIG. 2 shows another embodiment of plasma CVD apparatus according to the present invention.

FIG. 2 shows another embodiment of the present invention. FIG. 2 shows a partially enlarged cross-section view of plasma CVD apparatus having a gas introduction part designed differently from the one shown in the preferred embodiment given by FIG. 1. The gas introduction part of the plasma CVD apparatus shown in FIG. 2 comprises: a pipe (40) made of aluminum or aluminum alloy; a pipe (42) made of aluminum, aluminum alloy or austenitic stainless steel and having an inner diameter larger than that of the pipe (40); and a connection port (44) made of alumina ceramics and having an inner diameter equivalent to that of the pipe (42); with all three components connected coaxially and serially. The showerhead (5) and the two pipes (40, 42) are electrically insulated by means of the connection port (44) made of alumina ceramics, so that the high-frequency power applied to the showerhead (5) does not flow into the pipes (40, 42, 45). The connection port (44) can also be installed in the apparatus shown in FIG. 1 for the same purposes.

Installed inside the pipe (42) is a pipe (43) made of alumina ceramics that has an inner diameter equivalent to that of the pipe (40) and expands in the axial direction. This pipe (43) is installed coaxially with the pipe (40), and its top end connects to the bottom end of the pipe (40). The bottom end of the pipe (43) connects to a center opening (52) provided in a rectifying plate (49). The inner diameter of the pipe (43) may be 20-40 mm, the inner diameter of the pipe (40) may be 25-50 mm, and the length of the pipe (43) may be 50-200 mm. The pipe (43) and the plate (49) can be attached by press-fitting.

FIG. 3(B) shows a perspective view of this rectifying plate (49). This rectifying plate (49) is a ceramic disc with a thickness in a range of 3 mm to 20 mm, or preferably in a range of 5 mm to 10 mm, in which a relatively large center opening (52) is provided together with multiple, relatively small through-holes (50) arranged radially from the center at an equal spacing. The rectifying plate (49) can also be made of sapphire, aluminum, aluminum alloy, aluminum nitride or magnesium oxide. As shown in FIG. 2, the outer pipe (42) and inner pipe (43) comprise a double pipe structure, thereby forming a first channel (47) inside the pipe (43) and a second channel (48) between the pipe (43) and pipe (42). A reaction gas introduction pipe (45) having an inlet port (46) is connected to a side wall of the pipe (42), and this inlet port (46) connects to the second channel (48).

The reaction gas introduced from the inlet port (46) travels through the reaction gas introduction pipe (45) and second channel (48) and flows into a space (51) inside the reactor located above the showerhead (5). Thereafter, the reaction gas is flow-controlled by the rectifying plate (49) and travels through the multiple through-holes (50) provided in the rectifying plate (49) to eventually reach the showerhead (5). Finally, the reaction gas is injected uniformly into a process space (53) through the numerous pores provided in the showerhead (5).

On the other hand, cleaning gas for cleaning the interior of the reactor (2) is activated inside the remote plasma chamber (11) shown in FIG. 1, after which the gas travels through the valve (12) and is then introduced from a port (41) in the pipe (40). Thereafter, the activated cleaning gas travels through the interior of the pipe (40) and first channel (47) to eventually reach the showerhead (5) via the center opening (52) in the rectifying plate (49). Finally, the cleaning gas is injected uniformly into the process space (53) through the numerous pores provided in the showerhead (5).

Here, it should be noted that the first channel (47) and second channel (48) are completely separate and independent, and that while the reaction gas traveling through the second channel (48) is flow-controlled by the rectifying plate (49), the cleaning gas traveling through the first channel (47) is not limited at all by the rectifying plate (49). This solves the problem of inactivation, on the rectifying plate, of the active species contained in the cleaning gas, thereby resolving the problem of consequent drops in the cleaning speed.

Next, the operation of the plasma CVD apparatus according to an embodiment of the present invention is explained. The operation of the apparatus is divided into the film deposition sequence in which film is deposited on a semiconductor wafer, and the cleaning sequence implemented inside the reactor.

First, the film deposition sequence is explained. FIG. 1 is referenced again. First, the interior of the reactor (2) is vacuum exhausted via the exhaust port (20) by means of an external vacuum pump (not shown). The pressure in the reactor (2) is adjusted to a desired level in a range of 1 torr to 8 torr, by means of the pressure control unit (23) connected to the conductance adjustment valve (21).

Next, the temperature of the susceptor (3) heated by the heating element is controlled to a level between 300° C. and 420° C. by means of a temperature control unit (not shown) in order to heat the semiconductor wafer (4) to a specified temperature and maintain the wafer temperature. Thereafter, reaction gas (such as a mixture of TEOS(Si(OC2H5)4) and O2, etc.), whose flow rate is controlled by a mass flow rate controller (not shown), is introduced from the reaction gas inlet port (19), travels through the reaction gas introduction pipe (15), valve (13) and reaction gas introduction port (33), and flows into the pipe (14), after which the gas is introduced to the reactor (2) via the gas outlet port (17). The valve (12) provided in the pipe (14) prevents the reaction gas from entering the remote plasma discharge chamber. The reaction gas introduced from the gas outlet port (17) is flow-controlled by the rectifying plate (32), and then travels through the through-holes (28) and is injected uniformly toward the semiconductor wafer (4) through the numerous pores provided in the bottom surface of the showerhead (5). High-frequency power of 13.56 MHz or composite power of 13.56 MHz and 430 kHz is applied to the showerhead (5) by means of the high-frequency oscillator (10), to form a plasma reaction area in the reaction space between the showerhead (5) and the susceptor (3). Reaction gas molecules are activated by plasma energy in this area to cause chemical reaction, which then causes silicon oxide film or other thin film to deposit on the semiconductor wafer.

For example, an experiment was conducted where a reaction gas consisting of 250 sccm of TEOS and 2300 sccm of oxygen was used and, while holding the reactor (2) pressure at 400 Pa, first high-frequency power of 650 W and second high-frequency power of 500 W were applied to the showerhead (5) at 13.56 MHz and 430 kHz, respectively, to form silicon oxide film on a silicon wafer of 300 mm in diameter. In this experiment, silicon oxide film with a film thickness of 800 nm and uniformity of ±1.5% was formed within a period of 1 minute (here, the term "uniformity" refers to a percent value calculated by measuring at 49 points the film thickness of silicon oxide film grown on the silicone wafer, and then dividing the difference between the maximum and minimum measurements by a value corresponding to one-half the average of all measurements).

Once the thin-film deposition process is completed, the valve (13) is closed. At the same time, the gate valve (6) is opened and the processed semiconductor wafer (4) is carried out of the reactor (2) to the transfer chamber (29) through the opening (8) by means of the blade (31) of the automatic transfer robot (30). This completes the film deposition sequence. Thereafter, the interior of the reactor (2) is vacuum exhausted, and then an unprocessed semiconductor wafer is carried in from the transfer chamber (29) by means of the automatic transfer robot (30). The gate valve (6) is closed, and the aforementioned film deposition sequence is repeated.

Next, the cleaning sequence is explained. As the aforementioned film deposition sequence is implemented repeatedly, reaction product attaches to the interior walls of the reactor (2) as well as surface of the susceptor (3). This undesired product gradually accumulates and eventually separates and detaches to float inside the reactor and cause particle contamination. As a countermeasure to this particle contamination, a cleaning sequence is implemented regularly to clean the interior of the reactor (2).

First, the valve (13) is closed. At the same time, the valve (12) is opened and the interior of the reactor (2) is vacuum exhausted, after which the pipe (14) and the valve (12) are heated to at least 100° C. to allow for quick purging of the gas flowing through the pipe and valve.

Next, cleaning gas (such as a mixed gas consisting of NF3 and argon) is controlled to a specified flow rate and introduced from the cleaning-gas inlet port (18) into the remote plasma discharge chamber (11) via the pipe (16). Inside the remote plasma discharge chamber (11), high-frequency power of 300 kHz to 500 kHz is supplied to the cleaning gas for a power output of 1000 W to 5000 W. This energy causes the cleaning gas to dissociate and activate at a specified efficiency to generate active fluorine species.

The generated active fluorine species travel through the pipe (14) and valve (12), and are then introduced into the reactor (2) via the gas outlet port (17). The valve (13) provided inside the pipe (15) prevents the active fluorine species from flowing toward the reaction gas source. The active fluorine species introduced from the gas outlet port (17) are flow-controlled by the rectifying plate (32), after which they travel through the through-holes (28) and are injected uniformly into the interior of the reactor through the numerous pores provided in the bottom surface of the showerhead (5). The injected active fluorine species chemically react with the solid silicon oxide attached to the interior walls, etc., of the reactor, and gasify the silicon oxide attachments. As the number of gaseous molecules increases in the reactor and the reactor pressure rises as a result, the control unit (23) controls the opening angle of the conductance control valve (21) in real time in response to the reading on the pressure gauge (24). As a result, the pressure inside the reactor (2) is always kept constant while cleaning is implemented.

For example, an experiment was conducted where a cleaning gas consisting of 1.2 slm of NF3 and 5 slm of Ar was used and, while holding the reactor (2) pressure at a level between 500 Pa and 700 Pa, high-frequency power of 2700 W was applied to the remote plasma discharge chamber (11) at 400 kHz. In this experiment, the silicon oxide attached to the interior walls of the reactor (2) could be cleaned at a rate of 1.15 microns per minute (see Example 1 shown below). After the cleaning sequence is completed, the film deposition sequence is started again.

EXAMPLES

A comparative experiment on cleaning speed was conducted. The details of the experiment are explained below.

In the experiment, a process for depositing 500 m silicon oxide film on a silicon wafer, and a process for cleaning the reactor, were implemented repeatedly for a total of 40,000 silicon wafers under the gas and pressure conditions specified above, after which 500 nm film was deposited on one identical wafer, and then the cleaning sequence was implemented again to measure the cleaning speed. The results of this experiment are shown in Table 1. Here, "Conventional" represents a condition in which a general rectifying plate made of conventional alumina ceramics (a purity of 99.5% or higher, e.g., 99.7%) was used. "Example 1" represents a condition in which a sapphire rectifying plate conforming to the present invention was used. "Example 2" represents a condition in which a plasma CVD apparatus with a double pipe structure (and a rectifying plate made of alumina ceramics) was used in conformance with the present invention.

The configurations and conditions:
Rectifying plate: The number of through-holes: 6; the inner diameter: 6 mm; the thickness of the plate: 4 mm; the outer diameter of the plate: 350 mm.
Apparatus: Eagle®12 (ASM JAPAN, K.K.).
The distance between the rectifying plate and the shower plate: 2 mm.
The distance between the rectifying plate and the gas outlet port: 3 mm.
Cleaning conditions: NF3: 1.2 slm; Ar: 5 slm; Pressure: 650 Pa; Remote plasma unit: 2.8 kW, 400 kHz.

TABLE 1

|  | Conventional | Example 1 | Example 2 |
|---|---|---|---|
| Cleaning speed | 0.70 µm/min | 1.15 µm/min | 1.50 µm/min |

From the results in Table 1, it is clear that by using the sapphire rectifying plate, the rate of inactivation of active species due to collision decreased and thereby the cleaning speed was effectively maintained higher than when the conventional rectifying plate made of alumina ceramics was used. It is also shown that by using the plasma CVD apparatus with a double pipe structure, the aforementioned effect became more prominent. Incidentally, the silicon oxide film deposited on silicone wafers with a diameter of 300 mm by the plasma CVD apparatus used in Example 2 had a film thickness of 795 nm and uniformity of ±1.6%. These numbers indicate equivalent quality to the film deposited by the plasma CVD apparatus illustrated in FIG. 1.

In an embodiment where the rectifying plate is made of sapphire or alumina ceramics with a purity of 99.95% or higher, the cleaning rate can increase by 30% to 100% as compared with the conventional rectifying plate (made of conventional alumina ceramics with a purity of 99.7%), and in another embodiment where the piping is composed of inner and outer pipes, the inner pipe being connected to the rectifying plate, the cleaning rate can increase by 50% to 200% as compared with the conventional rectifying plate.

The present invention can be applied to any suitable plasma apparatuses including conventional apparatus such as those disclosed in the references discussed earlier.

The present invention claims priority to Japanese Patent Application No. 2004-316503, filed on Oct. 29, 2004, the disclosure of which is incorporated herein by reference.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A gas-introducing system for plasma CVD and cleaning, comprising:
   a showerhead comprising a top plate with a gas inlet port through which a reaction gas or activated cleaning gas is to be introduced into an interior space of the showerhead, and a shower plate having multiple holes though which the reaction gas or activated cleaning gas is to be discharged into a reactor;
   a rectifying plate installed in the interior space of the showerhead, dividing the interior space into an upper space and a lower space which are of substantially equal diameter, and having multiple holes through which the upper space and the lower space are communicated;
   a means for inhibiting inactivation of active species of the activated cleaning gas at the rectifying plate; and
   a piping unit for connecting the gas inlet port of the showerhead to a pipe extending from a remote plasma unit and a reaction gas introduction port,
   wherein the means is a structure wherein the piping unit comprises inner and outer pipes coaxially disposed, said inner pipe connecting the pipe extending from the remote plasma unit and the rectifying plate and communicating the remote plasma unit and the lower space of the showerhead without exposing the active species of cleaning gas to the upper space of the showerhead, said outer pipe being provided with a connection port and connecting the pipe extending from the remote plasma unit and the top plate via the connection port which connects the outer pipe and the top plate and insulates the outer pipe from the top plate, said outer pipe communicating the reaction gas introduction port and the upper space of the showerhead and also communicating with the lower space of the showerhead via the rectifying plate.

2. The gas-introducing system according to claim 1, wherein the inner pipe constitutes a straight downward passage of the active species of cleaning gas from the remote plasma unit which is open to the lower space of the showerhead.

3. The gas-introducing system according to claim 2, wherein the piping unit is provided with a valve disposed between the remote plasma unit and the lower space of the showerhead along the straight downward passage, said valve having no internal structure that limits the flow of the active species of cleaning gas when the valve is open.

4. The gas-introducing system according to claim 1, wherein the holes of the rectifying plate have a size larger than that of the holes of the shower plate, and the number of the holes of the rectifying plate is less than that of the holes of the shower plate.

5. The gas-introducing system according to claim 1, wherein the rectifying plate has a thickness of about 3 mm to about 20 mm.

6. The gas-introducing system according to claim 1, wherein a distance between the rectifying plate and the top plate is about 1 mm to about 20 mm, and a distance between the rectifying plate and the shower plate is about 1 mm to about 20 mm.

7. The gas-introducing system according to claim 1, wherein the piping unit includes an insulating member which insulates the piping unit from the top plate.

8. The gas-introducing system according to claim 1, wherein the showerhead is connected to an RF power source.

9. The gas-introducing system according to claim 1, wherein the reactor is a reactor of a capacitively-coupled plasma CVD apparatus.

10. The gas-introducing system according to claim 1, wherein the rectifying plate is made of a material selected from a group consisting of sapphire and alumina ceramics with a purity of 99.95% or higher.

11. The gas-introducing system according to claim 1, wherein the piping unit comprises the inner and outer pipes which are disposed in a center of the rectifying plate.

12. The gas-introducing system according to claim 1, wherein the outer pipe is made of aluminum or aluminum alloy, and the inner pipe and the connection port are made of alumina ceramics.

13. The gas-introducing system according to claim 1, wherein the inner pipe has a flange at an upper end of the inner pipe contacting the pipe from the remote plasma unit, said flange being supported by the outer pipe at an upper end of the outer pipe.

14. A self-cleanable plasma CVD processing apparatus comprising:
- a reactor;
- a susceptor provided inside the reactor to place a semiconductor substrate thereon;
- the gas-introducing system of claim 1 wherein the showerhead is installed parallel to and facing the susceptor;
- a remote plasma unit connected to the gas-introducing system to activate cleaning gas; and
- at least one high-frequency power supply installed outside the reactor to supply power to the showerhead or the susceptor.

15. A self-cleanable plasma CVD processing apparatus comprising:
- a reactor;
- a susceptor provided inside the reactor to place a semiconductor substrate thereon;
- a showerhead provided inside the reactor and installed in parallel with and facing the susceptor;
- a rectifying plate installed in an interior space of the showerhead and having multiple through-holes, said rectifying plate dividing the interior space into an upper space and a lower space which are of substantially equal diameter;
- at least one high-frequency power supply installed outside the reactor to supply power to the showerhead or the susceptor;
- a remote plasma discharge chamber installed outside the reactor to activate cleaning gas;
- a first pipe connecting a pipe extending from the remote plasma discharge chamber with the showerhead via a connection port which connects the outer pipe and the top plate and insulates the first pipe from the showerhead; and
- a second pipe installed inside the first pipe coaxially with the first pipe and connecting the pipe extending from the remote plasma unit and the rectifying plate, thereby forming a first channel inside the second pipe and a second channel between the first pipe and the second pipe,
- wherein a reaction gas channel is formed by the second channel and the upper space and the lower space of the showerhead so that a reaction gas is diffused to the rectifying plate via the second channel and the upper space and supplied from the showerhead via the lower space, and a cleaning gas channel is formed by the first channel and the lower space of the showerhead so that the activated cleaning gas is supplied from the showerhead via the first channel and the lower space without passing through the upper space and without being diffused through the rectifying plate.

16. The apparatus according to claim 15, wherein the activated cleaning gas contains active fluorine species.

17. The apparatus according to claim 15, wherein the rectifying plate is composed of a material selected from the group consisting of alumina ceramics, sapphire, aluminum, aluminum alloy, aluminum nitride, and magnesium oxide.

18. The apparatus according to claim 15, wherein the first channel is a straight downward passage extending to the lower space of the showerhead, the system further comprising a valve disposed and communicating between the remote plasma unit and the lower space of the showerhead along the straight downward passage, said valve having no internal structure that limits the flow of the active species of cleaning gas when the valve is open.

19. The apparatus according to claim 15, wherein the first pipe and the pipe from the remote plasma unit are made of aluminum or aluminum alloy, and the second pipe and the connection port are made of alumina ceramics.

20. The apparatus according to claim 15, wherein the second pipe has a flange at an upper end of the second pipe contacting the pipe from the remote plasma unit, said flange being supported by the first pipe at an upper end of the first pipe.

* * * * *

UNITED STATES PATENT AND TRADEMARK OFFICE
CERTIFICATE OF CORRECTION

PATENT NO. : 7,718,004 B2  Page 1 of 1
APPLICATION NO. : 11/262103
DATED : May 18, 2010
INVENTOR(S) : Kiyoshi Satoh et al.

It is certified that error appears in the above-identified patent and that said Letters Patent is hereby corrected as shown below:

At column 10, line 52, change "500 m" to --500 nm-- therefor.

At column 11, line 60, in Claim 1, change "though" to --through-- therefor.

Signed and Sealed this

Twelfth Day of October, 2010

David J. Kappos
*Director of the United States Patent and Trademark Office*